US006768438B1

(12) United States Patent
Schofield et al.

(10) Patent No.: US 6,768,438 B1
(45) Date of Patent: Jul. 27, 2004

(54) CURRENT DAC CODE INDEPENDENT SWITCHING

(75) Inventors: William G. J. Schofield, North Andover, MA (US); Douglas A. Mercer, Bradford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/351,066

(22) Filed: Jan. 24, 2003

(51) Int. Cl.[7] .................................................. H03M 1/66

(52) U.S. Cl. ....................................... 341/144; 327/408

(58) Field of Search ................................ 341/144, 136, 341/135

(56) References Cited

U.S. PATENT DOCUMENTS 4,056,740 A 11/1977 Schoeff ...................... 307/362
5,148,165 A 9/1992 Phillips ...................... 341/136
5,343,196 A * 8/1994 Harston ...................... 341/144
5,909,187 A 6/1999 Ahuja ........................ 341/136
6,344,816 B1 2/2002 Dedic ......................... 341/144
6,369,734 B2 * 4/2002 Volk .......................... 341/144
6,621,438 B1 9/2003 Hong ......................... 341/144
2002/0190778 A1 12/2002 Curry et al. ................ 327/408
2003/0043062 A1 3/2003 Dedic et al. ................ 341/144

OTHER PUBLICATIONS

Curry et al., "Apparatus and method for minimizing spurious noise in switched current steering architectures", US patent application No. 09/934,775, filed on Aug. 21, 2001.*
Park, S., et al, "A Digital–to–Analog Converter Based on Differential–Quad Switching", *IEEE Journal of Solid–State Circuits,* vol. 37, No. 10, Oct. 2002.

* cited by examiner

*Primary Examiner*—Jean Bruner Jeanglaude
(74) *Attorney, Agent, or Firm*—Bromberg & Sunstein LLP

(57) ABSTRACT

Methods and devices for code independent switching in a digital-to-analog converter (DAC) are described. A synchronous digital circuit is triggered by a clocking signal and develops a digital data signal. A current steering circuit has a common source node for supplying current, and develops an analog output signal representative of the digital data signal. Any switching disturbances at the common source node are substantially data independent.

26 Claims, 5 Drawing Sheets

100 101 102 103 104 105 106 N1 N2 D SET Q CLR $\overline{Q}$ +-

CURRENT DAC CODE INDEPENDENT SWITCHING

FIELD OF THE INVENTION

The invention generally relates to electronic signal processing, and more specifically, to digital to analog signal conversion.

BACKGROUND ART

A current steering digital-to-analog converter (DAC) converts a digital data stream input into a corresponding analog signal output. FIG. 1 shows a portion of a typical current steering DAC 100 in which a digital data stream is applied to a synchronous digital output latch 101. "Synchronous" means that the data on the latch input is transferred to the output in response to triggering of the latch by a clocking signal In real world applications, considerable digital processing is involved in producing such a digital data stream, but in the context of a DAC, such preceding digital circuitry need not be described. When the latch 101 is clocked, the data present on the D-input is transferred to the Q output, and its complement is transferred to the Q-bar output.

The outputs of latch 101 asynchronously control switch drivers 102, which in turn control differential switching elements 103 that control a constant current source supplied from a common source node. "Asynchronously" means that the logic state of the outputs of the switch drivers 102 and the differential switching elements 103 change state in response to their inputs changing state rather than in response to a clocking signal. For a given logic state present on the output of the latch 101, one switch of the differential switching elements 103 will be on, and the other will be off. When the logic state on the output latch 101 changes, the on-off states of the differential switching elements 103 also change correspondingly. Whichever differential switching element 103 is on provides a current path for constant current source 104 through one of the analog output resistors 105. Thus, an analog signal output signal is developed at output terminals 106.

In theory, such a current steering DAC 100 can operate at any frequency to provide an analog output corresponding to the digital data input. In the real world, errors and noise occur throughout the system, the effects of which increase with operating frequency. These effects may be code dependent and may result in harmonic distortion and harmonic spurs in the analog output signal.

One approach to reducing code dependent noise is presented by FIG. 8 of U.S. Pat. No. 6,344,816, which describes adding an additional clocked circuit called a "dummy latch" in parallel with the output latch 101. The output of the dummy latch is not itself used in any way, rather the dummy latch and the output latch 101 are connected and operated such that with every cycle of the clocking signal, one of the latches will change state and the other will not. Thus, if the output latch 101 changes state with the data signal, the dummy latch maintains its logic state, and if the output latch 101 maintains its logic state constant with an unchanging data signal, then the dummy latch will change logic states. According to the '816 patent, this arrangement maintains a constant loading on the clocking signal that is independent of the data signal logic state. There is no suggestion in the '816 that its teaching might be extensible beyond its focus on the clocking signal.

SUMMARY OF THE INVENTION

A representative embodiment of the present invention includes a method and device for code independent switching in a digital-to-analog converter (DAC). In the DAC shown in FIG. 1, if the switch drivers 102 can completely settle for every data transition from latch 101, the switching characteristics will be constant for the differential switching elements 103. As the output frequency increases, the differential switching elements 103 are switched faster, requiring the switch drivers 102 to settle in a shorter time. If the switch drivers 102 do not settle to the same value each time, the switching characteristics may vary and code dependent distortion will result. Embodiments of the present invention avoid such code dependent distortion.

A synchronous digital circuit is triggered by a clocking signal and develops a digital data signal. A current steering circuit has a common source node for supplying current, and develops an analog output signal representative of the digital data signal. Any switching disturbances at the common source node are substantially data independent.

In a further embodiment, the current steering circuit contains multiple switching elements arranged so that a constant number of switching elements change conduction state with every cycle of the clocking signal. In addition or alternatively, the current steering circuit may receive the digital data signal as a first input and an auxiliary data signal as a second input. The auxiliary data signal changes logic state when: (i) triggered by the clocking signal, and (ii) the digital data signal does not change logic state.

In another embodiment, the current steering circuit includes (i) a switch driver circuit for developing a switch control signal representative of the digital data signal, and (ii) a differential switching circuit responsive to the switch control signal for switching the current from the common source node to develop the analog output signal.

The current steering circuit may use a single switching element for developing the analog output signal.

A representative embodiment of the present invention also includes a method and device for code independent switching in a digital-to-analog converter (DAC). A synchronous digital circuit is triggered by a clocking signal and develops a digital data signal. A current steering circuit has a common source node for supplying current, and develops an analog output signal representative of the digital data signal. The current steering circuit has multiple switching arrangements arranged so that a constant number of switching elements change conduction state with every cycle of the clocking signal.

In a further such embodiment, the current steering circuit receives the digital data signal as a first input and an auxiliary data signal as a second input, the auxiliary data signal changing logic state when: (i) triggered by the clocking signal, and (ii) the digital data signal does not change state.

In another embodiment, the current steering circuit includes: (i) a switch driver circuit for developing a switch control signal representative of the digital data signal, and (ii) a differential switching circuit responsive to the switch control signal for switching the current from the common source node to develop the analog output signal.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

Figure 1:
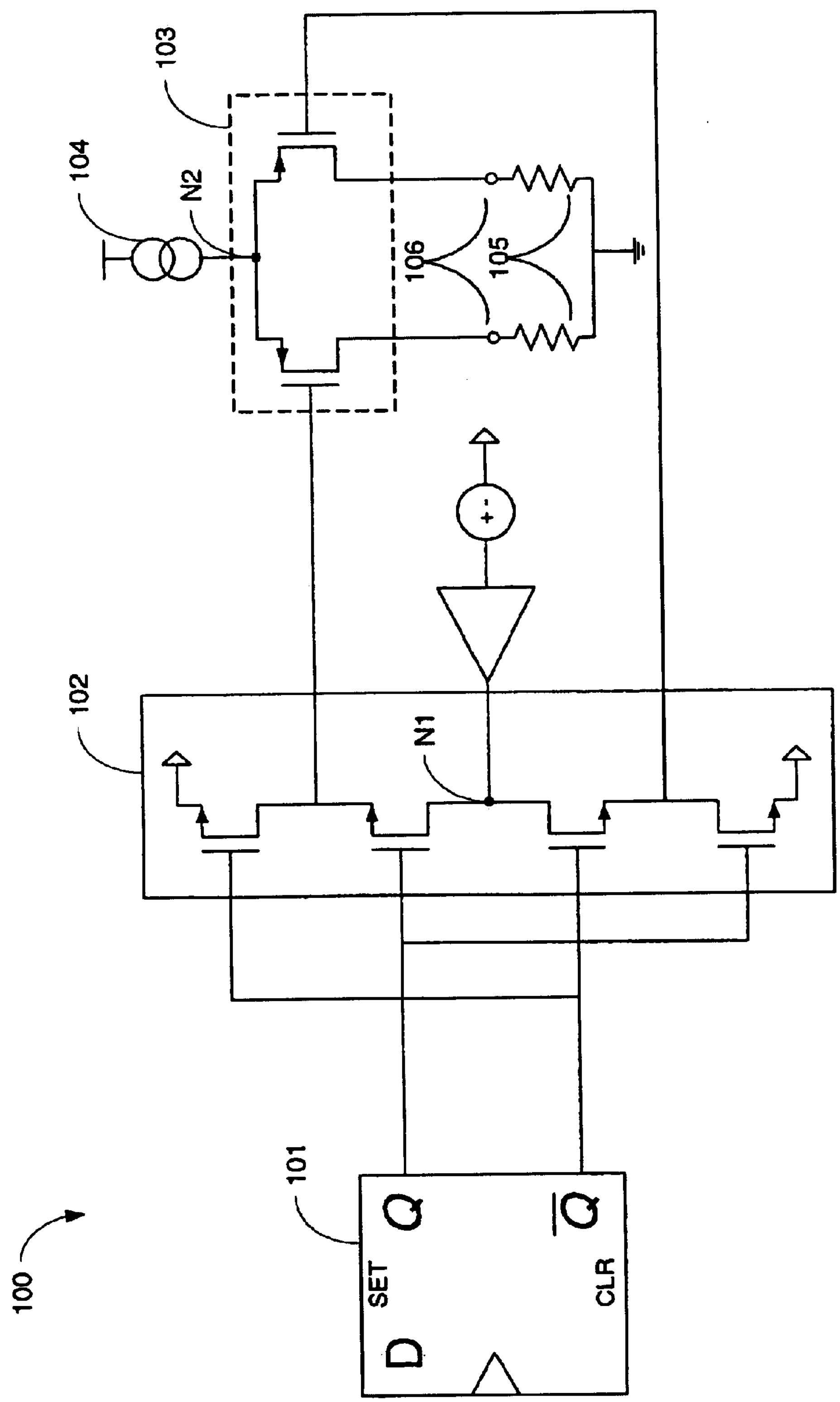
FIG. 1 shows a typical prior art current steering DAC.

A representative embodiment of the present invention includes a method and device for code independent switching in a digital-to-analog converter (DAC). While U.S. Pat. No. 6,344,816 limited its focus to removing code dependent loading on the clocking signal supplied to clocked digital elements, but embodiments of the present invention are directed at preventing code dependent noise generated by changes in the conduction states of the unclocked circuit switching elements—for example, the switch drivers 102 and the differential switching elements 103 in FIG. 1. This ensures that electrical disturbances on the common source node of the differential switching elements 103 are data independent.

Figure 2:
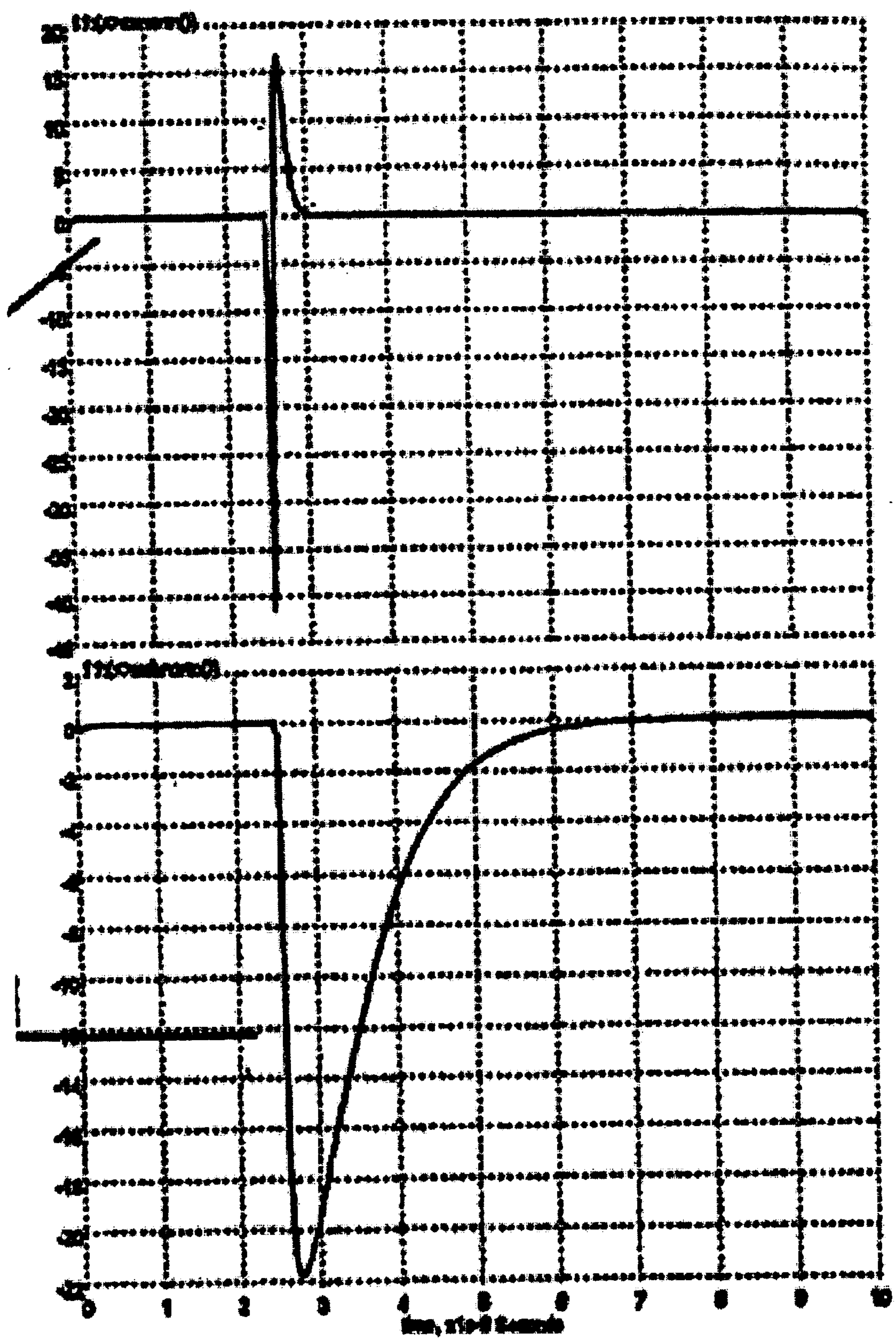
FIG. 2 shows various waveform traces associated with the DAC in FIG. 1.

It can be shown that when the switch drivers 102 change conduction state between ON and OFF, some energy is taken from the common source node of the differential switching elements 103 to charge capacitances on the output of the switch drivers 102. The bottom trace in FIG. 2 shows a voltage waveform reflecting this capacitive charging effect at high frequency (above 100 MHz) at node N1, the bias voltage node for switch drivers 102. This capacitive charging effect, in turn, contributes to a glitch in the voltage at node N2 (the upper trace in FIG. 2), the common source node which supplies the constant current source 104 to the differential switching elements 103. This glitch at node N2 then affects the analog output signal at output terminals 106.

As explained in the Summary section above, if the switch drivers 102 can completely settle for every data transition from latch 101, the switching characteristics will be constant for the differential switching elements 103. As the output frequency increases, the differential switching elements 103 are switched faster, requiring the switch drivers 102 to settle in a shorter time—i.e., the capacitive charging depicting in the lower trace of FIG. 2. If the switch drivers 102 do not settle to the same value each time, the switching characteristics may vary and code dependent distortion will result. That is, the noise glitch at common source node N2 will vary in amplitude and period with the digital data stream input, and be passed along through the differential switching elements 103 as harmonic distortion in the analog output signal at output terminals 106.

Embodiments of the present invention address this common source node noise by various techniques, which focus on preventing code dependent switching disturbances caused by either or both of the switch drivers 102 and the differential switching elements 103. This objective can be satisfied by adapting data switching blocks so that for every clocking cycle, the same number of switches turn ON and OFF, regardless of whether or not the data signal changes logic states. This ensures that disturbances on the common source node are uncorrelated to the data stream so that any switching noise generated will have frequency components at the sample rate and its harmonics.

Figure 3A:
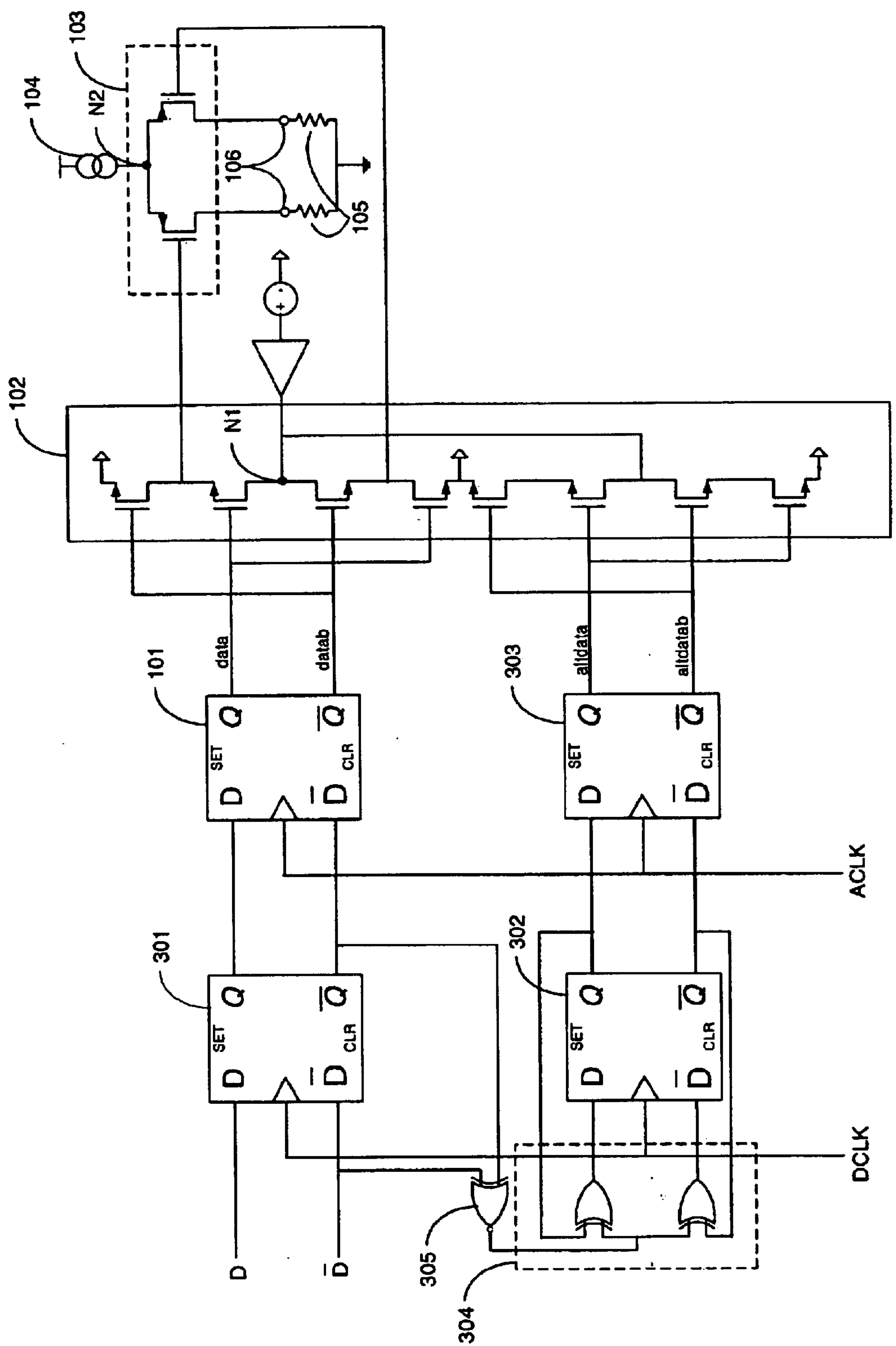
FIG. 3A shows a current steering DAC according to one embodiment of the present invention.
Figure 3B:
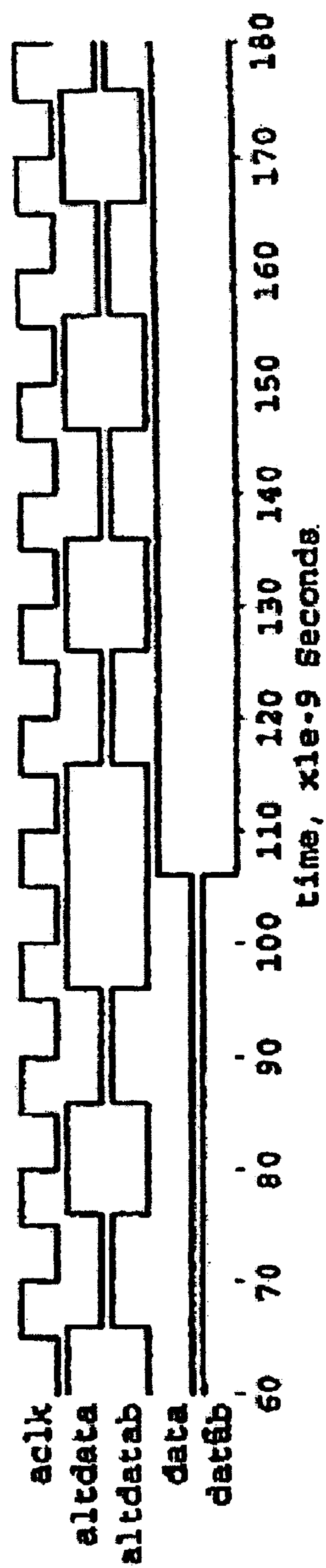
FIG. 3B shows the associated dock and data waveforms for the DAC circuit in FIG. 3A.

One specific embodiment, shown in FIG. 3A, uses an alternate data path to ensure that the switch drivers 102 draw the same amount of energy every time that the output latch 101 is clocked. FIG. 3B shows the associated clock and data waveforms for the DAC circuit in FIG. 3A. In the DAC shown in FIG. 3A, the digital output latch 101 is preceded by a data transfer latch 301. Also connected to the data transfer latch 301 are an alternate data transfer latch 302 and an alternate data output latch 303. Connected to the D-input of the alternate data transfer latch 302 is an alternate data gate 304 controlled by data transfer XNOR 305. The Q and Q-bar outputs of the alternate data latch 302 are input to the alternate data gate 304, and the D-input and Q-bar output of the data transfer latch 301 are the inputs to the data transfer XNOR 305.

On docking transitions when the true data stream stays constant, the alternate data latch 303 is forced to change logic states. On clocking transitions when the true data stream changes states, the alternate data stream output latch 303 maintains its logic state. By connecting the switch drivers 102 to a true data path and an alternate data path, and ensuring that at every clocking cycle one but not both of the two data paths changes conduction state, the switch drivers 102 will draw the same amount of energy with every clock pulse. The switch drivers 102 will therefore settle to the same value independent of the data, resulting in no code dependent switching characteristics, i.e., constant switching levels are maintained that are data independent. A second advantage of such an approach is that the final sample clocking signal, ACLK, sees a data transition at the clock rate, stabilizing any code dependent load on the clock signal and reducing code dependent jitter.

Figure 4:
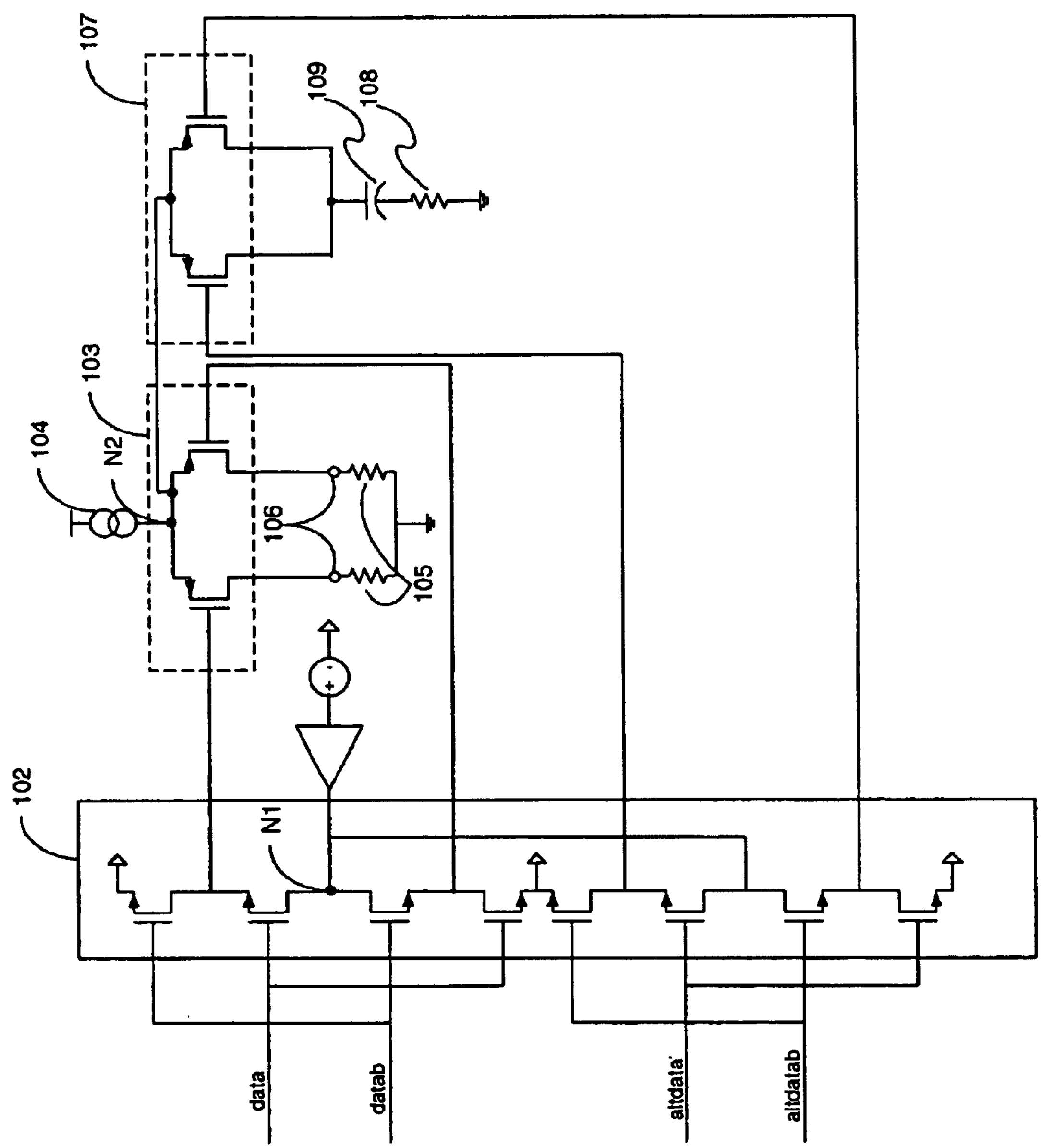
FIG. 4 shows a further embodiment of the present invention.

The approach used in FIG. 3A is extended further in the circuit shown in FIG. 4. In this embodiment, the switch drivers 102 control both the differential switching elements 103 and an alternate differential switching block 107. The alternate differential switching block 107 shares common source node N2 with the differential switching elements 103, but drives its own separate alternate AC load resistor 108 via coupling capacitor 109. Providing an alternate AC data path without a corresponding alternate DC current path for alternate differential switching block 107 avoids problems that may arise if common source node N2 were required to supply current to the alternate differential switching block 107.

As before, the differential switching elements 103 are driven in accordance with the digital data stream to develop a corresponding analog output signal at output terminals 106. As with FIG. 3A, in FIG. 4, the alternate data stream changes state when the true data stream does not, and in turn, the switch drivers 102 create a corresponding data transition in the alternate differential switching block 107. Thus, four switches (differential switching elements 103 and alternate differential switching block 107) are coupled to common source node N2, and at every clocking cycle, exactly one of these switches will turn on and one will turn off.

Although various exemplary embodiments of the invention have been disclosed, it should be apparent to those skilled in the art that various changes and modifications can be made which will achieve some of the advantages of the invention without departing from the true scope of the invention. For example, embodiments could be implemented with N-MOS or bi-polar switches. Or, single switch output stages could be used instead of the two-switch differential switching circuits shown. Other implementation details could also be altered in a specific embodiment of the invention.

What is claimed is:

1. A digital to analog converter comprising:

a synchronous digital circuit triggered by a clocking signal and developing a digital data signal;

a current steering circuit having a common source node for supplying current to develop an analog output signal representative of the digital data signal, wherein any switching disturbances at the common source node are substantially data independent.

2. A converter according to claim 1, wherein the current steering circuit contains a plurality of switching elements arranged so that a constant number of switching elements change conduction state with every cycle of the clocking signal.

3. A converter according to claim 2, wherein the current steering circuit receives the digital data signal as a first input and an auxiliary data signal as a second input, the auxiliary data signal changing logic state when:

i. triggered by the clocking signal, and ii. the digital data signal does not change logic state.

4. A converter according to claim 1, wherein the current steering circuit includes:

i. a switch driver circuit for developing a switch control signal representative of the digital data signal, and ii. a differential switching circuit responsive to the switch control signal for switching the current from the common source node to develop the analog output signal.

5. A converter according to claim 1, wherein the current steering circuit includes a single switching element for developing the analog output signal.

6. A method of signal processing comprising:

developing a digital data signal with a synchronous digital circuit triggered by a clocking signal;

developing an analog output signal representative of the digital data signal with a current steering circuit having a common source node that supplies current, wherein any switching disturbances at the common source node are substantially data independent.

7. A method according to claim 6, wherein the current steering circuit contains a plurality of switching elements arranged so that a constant number of switching elements change conduction state with every cycle of the clocking signal.

8. A method according to claim 6, wherein the current steering circuit receives the digital data signal as a first input and an auxiliary data signal as a second input, the auxiliary data signal changing logic state when:

i. triggered by the clocking signal, and ii. the digital data signal does not change logic state.

9. A method according to claim 6, wherein the current steering circuit includes:

i. a switch driver circuit for developing a switch control signal representative of the digital data signal, and ii. a differential switching circuit responsive to the switch control signal for switching the current from the common source node to develop the analog output signal.

10. A method according to claim 6, wherein the current steering circuit includes a single switching element for developing the analog output signal.

11. A digital to analog converter comprising:

a synchronous digital circuit triggered by a clocking signal and developing a digital data signal;

a current steering circuit having a common source node for supplying current to develop an analog output signal representative of the digital data signal, the current steering circuit including a plurality of switching elements arranged so that a constant number of switching elements change conduction state with every cycle of the clocking signal.

12. A converter according to claim 11, wherein the current steering circuit receives the digital data signal as a first input and an auxiliary data signal as a second input, the auxiliary data signal changing logic state when:

i. triggered by the clocking signal, and ii. the digital data signal does not change state.

13. A converter according to claim 11, wherein the current steering circuit includes:

i. a switch driver circuit for developing a switch control signal representative of the digital data signal, and ii. a differential switching circuit responsive to the switch control signal for switching the current from the common source node to develop the analog output signal.

14. A converter according to claim 11, wherein the current steering circuit includes a single switching element for developing the analog output signal.

15. A method of signal processing comprising:

developing a digital data signal with a synchronous digital circuit triggered by a clocking signal;

developing an analog output signal representative of the digital data signal with a current steering circuit having a common source node for supplying current, the current steering circuit including a plurality of switching elements arranged so that a constant number of switching elements change conduction state with every cycle of the clocking signal.

16. A method according to claim 15, wherein the current steering circuit receives the digital data signal as a first input and an auxiliary data signal as a second input, the auxiliary data signal changing logic state when:

i. triggered by the clocking signal, and ii. the digital data signal does not change state.

17. A method according to claim 15, wherein the current steering circuit includes:

i. a switch driver circuit for developing a switch control signal representative of the digital data signal, and ii. a differential switching circuit responsive to the switch control signal for switching the current from the common source node to develop the analog output signal.

18. A method according to claim 15, wherein the current steering circuit includes a single switching element for developing the analog output signal.

19. A digital to analog converter comprising:

a synchronous digital circuit triggered by a clocking signal and developing a digital data signal;

a current steering circuit including:

i. a switch driver circuit for developing from a common bias voltage node a switch control signal representative of the digital data signal, wherein any switching disturbances at the common bias voltage node are substantially data independent; and ii. a differential switching circuit responsive to the switch control signal for switching current supplied from a common source node to develop an analog output signal representative of the digital data signal.

20. A digital to analog converter according to claim 19, wherein the switch driver circuit contains a plurality of switching elements arranged so that a constant number of switching elements change conduction state with every cycle of the clocking signal.

21. A converter according to claim 19, wherein the current steering circuit receives the digital data signal as a first input and an auxiliary data signal as a second input, the auxiliary data signal changing logic state when:

i. triggered by the clocking signal, and ii. the digital data signal does not change logic state.

22. A converter according to claim 19, wherein the differential switching circuit includes a single switching element for developing the analog output signal.

23. A method of signal processing comprising:

developing a digital data signal with a synchronous digital circuit triggered by a clocking signal;

developing from a common bias voltage node a switch control signal representative of the digital data signal, such that any switching disturbances at the common source node are substantially data independent; and switching current supplied from a common source node in response to the switch control signal to develop an analog output signal representative of the digital data signal.

24. A method according to claim 23, wherein the switch control signal is developed by a plurality of switching elements arranged so that a constant number of switching elements change conduction state with every cycle of the clocking signal.

25. A method according to claim 24, wherein the plurality of switching elements receives the digital data signal as a first input and an auxiliary data signal as a second input, the auxiliary data signal changing logic state when:

i. triggered by the clocking signal, and ii. the digital data signal does not change logic state.

26. A method according to claim 23, wherein a single switching element develops the analog output signal.

* * * * *